United States Patent
Chung et al.

(10) Patent No.: US 12,406,834 B2
(45) Date of Patent: Sep. 2, 2025

(54) SUBSTRATE PROCESSING APPARATUS AND SUBSTRATE PROCESSING METHOD

(71) Applicant: IUCF-HYU (INDUSTRY-UNIVERSITY COOPERATION FOUNDATION HANYANG UNIVERSITY), Seoul (KR)

(72) Inventors: Chin Wook Chung, Seoul (KR); Moo Young Lee, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 338 days.

(21) Appl. No.: 17/617,982

(22) PCT Filed: Apr. 1, 2020

(86) PCT No.: PCT/KR2020/004441
§ 371 (c)(1),
(2) Date: Dec. 10, 2021

(87) PCT Pub. No.: WO2020/251148
PCT Pub. Date: Dec. 17, 2020

(65) Prior Publication Data
US 2022/0246407 A1   Aug. 4, 2022

(30) Foreign Application Priority Data
Jun. 11, 2019   (KR) .................. 10-2019-0068789

(51) Int. Cl.
*H01J 37/32* (2006.01)
*C23C 16/50* (2006.01)

(52) U.S. Cl.
CPC ........ *H01J 37/32697* (2013.01); *C23C 16/50* (2013.01); *H01J 37/32146* (2013.01); *H01J 37/3244* (2013.01); *H01J 2237/3341* (2013.01)

(58) Field of Classification Search
CPC .......... H01J 37/32697; H01J 37/32146; H01J 37/3244; H01J 2237/3341; H01J 37/32;
(Continued)

(56) References Cited

U.S. PATENT DOCUMENTS

| 217,329 A | * | 7/1879 | Briggs et al. ............. B25B 1/08 |
| | | | 269/130 |
| 4,659,449 A | * | 4/1987 | Watanabe ......... H01J 37/32431 |
| | | | 156/345.39 |

(Continued)

FOREIGN PATENT DOCUMENTS

| KR | 10-2010-0012436 A | 2/2010 |
| KR | 10-1010130 B1 | 1/2011 |

(Continued)

OTHER PUBLICATIONS

International Search Report of PCT/KR2020/004441 dated Jul. 15, 2020 [PCT/ISA/210].

*Primary Examiner* — Rudy Zervigon
(74) *Attorney, Agent, or Firm* — Sughrue Mion, PLLC

(57) ABSTRACT

The present invention relates to a substrate processing apparatus and a substrate processing method. A substrate processing apparatus according to an embodiment of the present invention includes a chamber; a susceptor located inside the chamber to support a substrate to be processed; a first plasma control plate located in an upper area of a space inside the chamber; a second plasma control plate located below the first plasma control plate while being spaced apart from the first plasma control plate by a predetermined distance; and a plasma control power source connected to
(Continued)

the first plasma control plate and the second plasma control plate.

5 Claims, 3 Drawing Sheets

(58) Field of Classification Search
CPC ........... H01J 37/32174; H01J 37/32935; H01J 37/3299; H01J 37/32972; H01J 37/32963; C23C 16/50; C23C 16/45565; C23C 16/45536; C23C 16/52; C23C 14/54; H01L 21/02; H01L 21/67; H01L 21/02274; H01L 21/67017; H01L 21/67253; H01L 21/67248; H01L 22/20
USPC ...... 118/723 ER, 723 E, 663, 665, 668, 688; 156/345.45, 345.24, 345.25, 345.26, 156/345.27, 345.28
See application file for complete search history.

(56) References Cited

U.S. PATENT DOCUMENTS

| | | | | |
|---|---|---|---|---|
| 5,154,943 | A * | 10/1992 | Etzkorn | C23C 16/455 427/166 |
| 6,511,575 | B1 * | 1/2003 | Shindo | B08B 7/0035 257/E21.582 |
| 6,656,540 | B2 * | 12/2003 | Sakamoto | C23C 16/452 156/345.46 |
| 7,244,474 | B2 * | 7/2007 | Hanawa | C23C 16/452 427/574 |
| 7,329,608 | B2 * | 2/2008 | Babayan | H01L 23/08 427/535 |
| 7,695,590 | B2 * | 4/2010 | Hanawa | C23C 16/045 156/345.43 |
| 8,608,853 | B2 * | 12/2013 | Tseng | H01L 21/67098 261/22 |
| 9,144,147 | B2 * | 9/2015 | Yang | H01J 37/32449 |
| 10,256,079 | B2 * | 4/2019 | Lubomirsky | C23C 16/505 |
| 10,403,507 | B2 * | 9/2019 | Choi | H01J 37/32357 |
| 10,697,062 | B2 * | 6/2020 | Kao | C23C 16/45587 |
| 10,727,080 | B2 * | 7/2020 | Wang | H01L 21/67069 |
| 10,903,054 | B2 * | 1/2021 | Singh | H01L 21/02049 |
| 11,062,920 | B2 * | 7/2021 | Berry, III | H01L 21/3065 |
| 2002/0129902 | A1 * | 9/2002 | Babayan | H01J 37/32009 156/345.43 |
| 2003/0062840 | A1 | 4/2003 | Moroz | |
| 2004/0144490 | A1 * | 7/2004 | Zhao | H01J 37/32082 156/345.47 |
| 2004/0194890 | A1 * | 10/2004 | Moroz | H01J 37/32082 156/345.48 |
| 2004/0219737 | A1 * | 11/2004 | Quon | H01J 37/32697 438/222 |
| 2005/0211170 | A1 * | 9/2005 | Hanawa | H01J 37/32449 118/723 R |
| 2005/0211171 | A1 * | 9/2005 | Hanawa | C23C 16/507 118/723 R |
| 2005/0211546 | A1 * | 9/2005 | Hanawa | H01J 37/32449 204/192.12 |
| 2005/0211547 | A1 * | 9/2005 | Hanawa | C23C 14/0036 204/192.12 |
| 2005/0214477 | A1 * | 9/2005 | Hanawa | C23C 16/452 427/569 |
| 2005/0214478 | A1 * | 9/2005 | Hanawa | C23C 16/452 427/569 |
| 2006/0019039 | A1 * | 1/2006 | Hanawa | C23C 16/045 427/523 |
| 2006/0019477 | A1 * | 1/2006 | Hanawa | C23C 14/48 257/E21.279 |
| 2014/0273411 | A1 * | 9/2014 | Abedijaberi | H01L 21/02381 438/478 |
| 2014/0283746 | A1 * | 9/2014 | Seo | C23C 16/513 118/723 R |
| 2014/0284404 | A1 * | 9/2014 | Kuah | C23C 16/45565 239/408 |
| 2015/0170943 | A1 * | 6/2015 | Nguyen | H01J 37/32082 156/345.33 |
| 2016/0217979 | A1 * | 7/2016 | Kim | H01J 37/3244 |
| 2016/0289830 | A1 * | 10/2016 | Abedijaberi | C23C 16/52 |
| 2017/0040170 | A1 * | 2/2017 | Guha | H01L 21/67069 |
| 2021/0074558 | A1 * | 3/2021 | Nam | H01J 37/32715 |
| 2022/0165546 | A1 * | 5/2022 | Lill | H01J 37/32082 |
| 2022/0307138 | A1 * | 9/2022 | Kordina | B01F 25/4336 |
| 2023/0313374 | A1 * | 10/2023 | Kim | C23C 16/45563 118/715 |

FOREIGN PATENT DOCUMENTS

| | | |
|---|---|---|
| KR | 10-2013-0005840 A | 1/2013 |
| KR | 10-2015-0125829 A | 11/2015 |
| KR | 10-1607520 B1 | 3/2016 |
| KR | 10-1717629 B1 | 3/2017 |

* cited by examiner

[FIG 1]
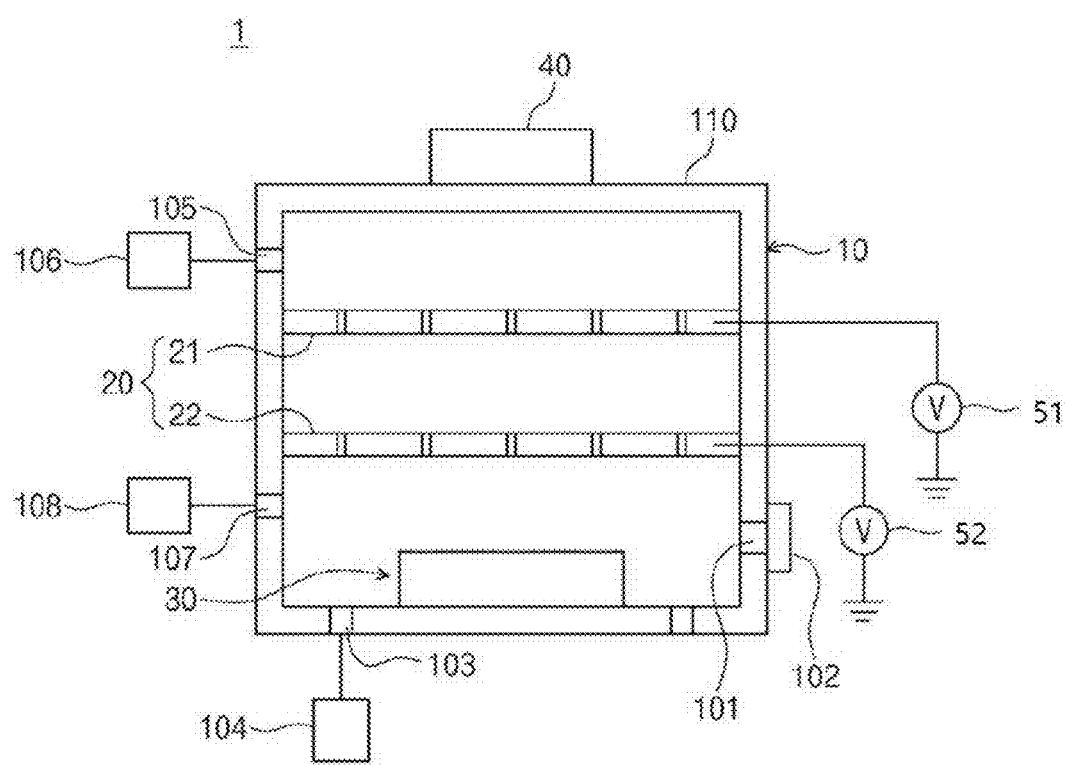

【FIG 2】
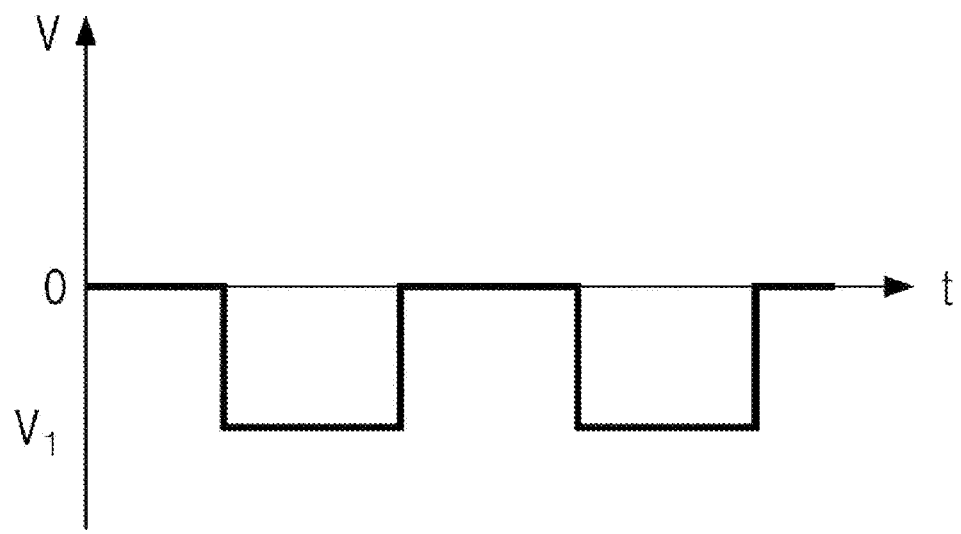
【FIG 3】
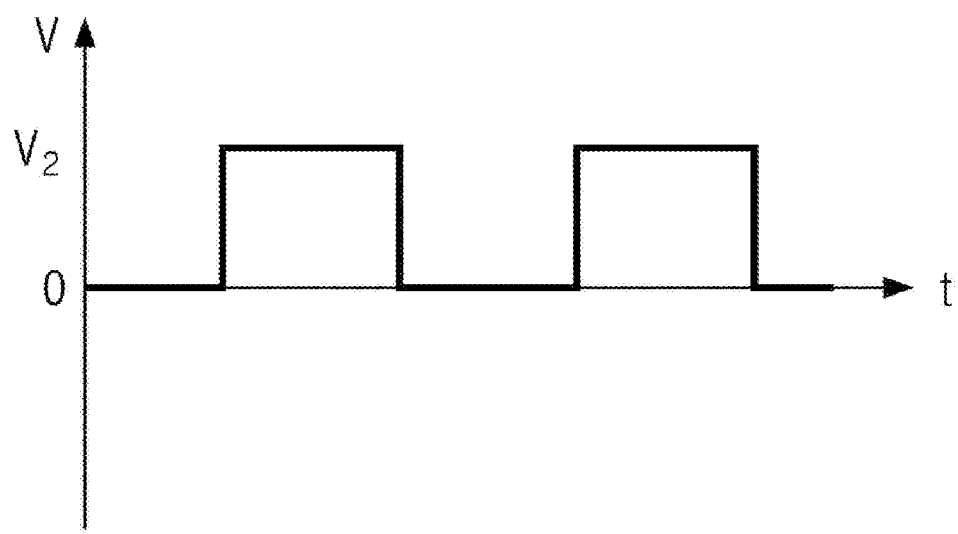

[FIG 4]
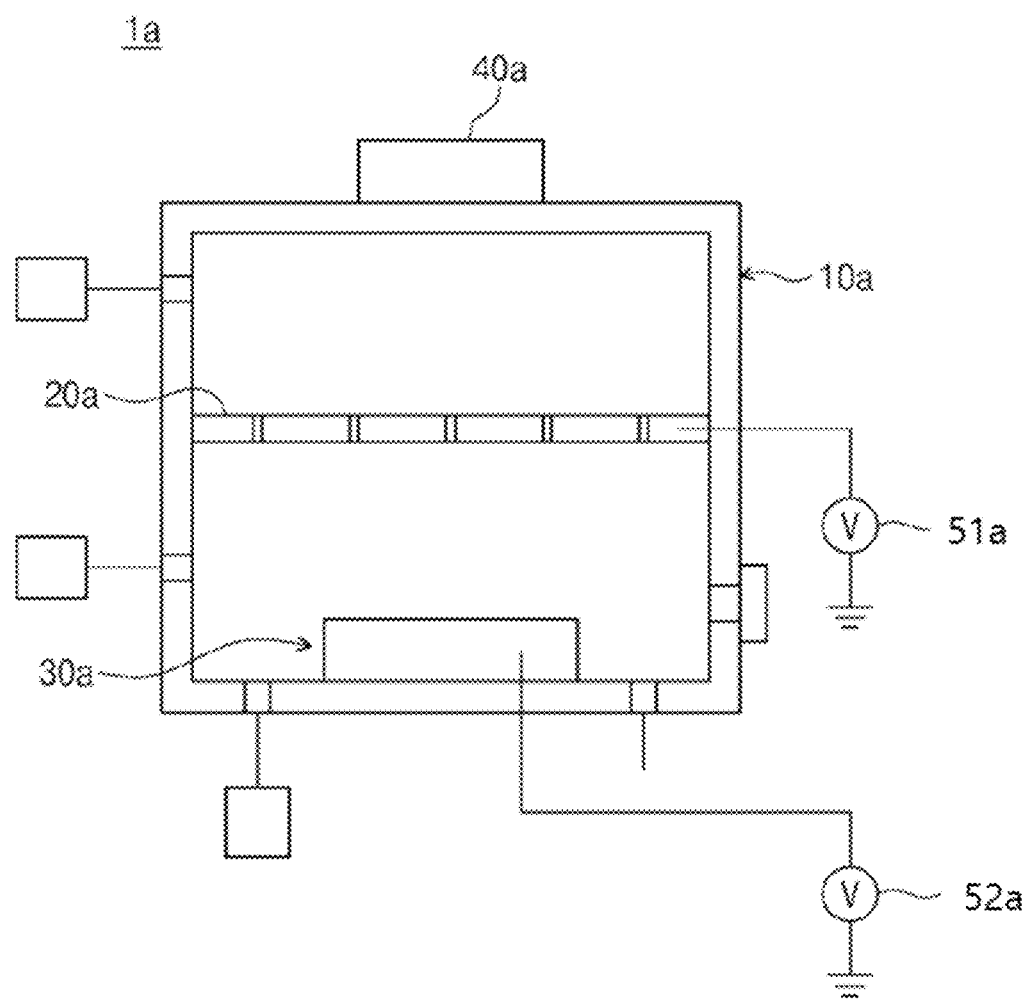

SUBSTRATE PROCESSING APPARATUS AND SUBSTRATE PROCESSING METHOD

CROSS REFERENCE TO RELATED APPLICATIONS

This application is a National Stage of International Application No. PCT/KR2020/004441, filed Apr. 1, 2020, claiming priority to Korean Patent Application No. 10-2019-0068789, filed Jun. 11, 2019.

TECHNICAL FIELD

The present invention relates to substrate processing apparatus and a substrate processing method, and more particularly, to substrate processing apparatus and substrate processing method capable of processing a substrate in units of atomic thickness.

BACKGROUND ART

Plasma may be used in a process for processing a substrate. For example, plasma may be used for an etching process or a deposition process. Plasma is generated by a very high temperature, a strong electric field, or a high-frequency electromagnetic field (RF electromagnetic fields), and refers to an ionized gas state composed of ions, electrons, radicals, and the like. In a conventional etching process, ion particles contained in plasma collide with a substrate. In addition, a deposition process may be performed by supplying a deposition material to the upper portion of a substrate after the gas including a material to be deposited on the substrate reacts with the plasma.

Due to the energy of ions, in the process of processing a substrate by the ions, it may be processed or damaged in a shape different from the originally intended processing shape. As the line width of a device is miniaturized, such damage to the substrate degrades the device property.

DISCLOSURE

Technical Problem

An object of the present invention is to provide a substrate processing apparatus and a substrate processing method capable of processing a substrate in units of atomic thickness.

Another object of the present invention is to provide a substrate processing apparatus and a substrate processing method capable of processing a substrate using electrons.

Still another object of the present invention is to provide a substrate processing apparatus and a substrate processing method capable of processing a large-area substrate using electrons.

Still another object of the present invention is to provide a substrate processing apparatus and a substrate processing method capable of performing a process in a state in which damage to the substrate is minimized.

Technical Solution

According to an embodiment, there is provided a substrate processing apparatus that includes a chamber; a susceptor located inside the chamber to support a substrate to be processed; a first plasma control plate located in an upper area of a space inside the chamber; a second plasma control plate located below the first plasma control plate while being spaced apart from the first plasma control plate by a predetermined distance; and a plasma control power source connected to the first plasma control plate and the second plasma control plate.

In addition, the plasma control power source may apply a voltage having a magnitude equal to or less than a ground state to the first plasma control plate.

In addition, the plasma control power source may apply a negative voltage in a form of a pulse to the first plasma control plate.

In addition, the plasma control power source may apply a voltage having a magnitude greater than or equal to the ground state to the second plasma control plate.

In addition, the plasma control power source may apply a positive voltage in a form of a pulse to the second plasma control plate.

In addition, the substrate processing apparatus may further include an upper gas supply source connected to a space formed above the first plasma control plate; and a lower gas supply source connected to a space formed below the second plasma control plate.

In addition, the upper gas supply source may supply a process gas reacting with the substrate to form a reaction layer, or an excitation gas excited by plasma.

In addition, the lower gas supply source may supply a process gas reacting with the substrate to form a reaction layer, or an excitation gas excited by plasma.

In addition, the plasma control power source may apply a voltage in a form of a pulse such that sink of a voltage applied to the first plasma control plate and the second plasma control plate is adjustable.

According to another embodiment, there is provided substrate processing apparatus that includes a chamber; a susceptor located inside the chamber to support a substrate to be processed; a plasma control plate located in a space inside the chamber; and a plasma control power source coupled to the plasma control plate and the susceptor.

In addition, the plasma control power source may apply a voltage having a magnitude equal to or less than a ground state to the plasma control plate and apply a voltage having a magnitude greater than or equal to the ground state to the susceptor.

According to still another embodiment, there is provided a substrate processing method that includes exciting plasma in an excitation space located above a first plasma control plate located in an upper area of an inner space of the chamber; moving electrons having energy adapted for overcoming a repulsive force caused by the first plasma control plate from the excitation space to a control space located below the first plasma control plate by applying a voltage having a magnitude equal to or less than a ground state to the first plasma control plate; and moving only electrons from the control space to a process space located below a second plasma control plate by applying a voltage having a magnitude greater than or equal to the ground state to the second plasma control plate located below the first plasma control plate.

In addition, the substrate processing method may further include reacting the process gas with a substrate located in the chamber to form a reaction layer after supplying a process gas into the chamber before exciting the plasma.

In addition, the reaction layer may be for an etching process, and the reaction layer reacts with electrons in plasma to be etched from the substrate.

In addition, the reaction layer may be for a deposition process, and the reaction layer reacts with a layer located under the reaction layer by energy provided from electrons in plasma.

Advantageous Effects

According to the embodiments of the present disclosure, it is possible to provide a substrate processing apparatus and a substrate processing method capable of processing a substrate in units of atomic thickness.

In addition, according to the embodiments of the present disclosure, it is possible to provide a substrate processing apparatus and a substrate processing method capable of processing a substrate using electrons.

In addition, according to the embodiments of the present disclosure, it is possible to provide a substrate processing apparatus and a substrate processing method capable of processing a large-area substrate using electrons.

In addition, according to the embodiments of the present disclosure, it is possible to provide a substrate processing apparatus and a substrate processing method capable of performing a process in a state in which damage to the substrate is minimized.

DESCRIPTION OF DRAWINGS

FIG. 1 is a view illustrating a substrate processing apparatus according to an embodiment of the present invention.

FIG. 2 is a diagram illustrating the voltage applied to the first plasma control plate according to an embodiment.

FIG. 3 is a diagram illustrating the voltage applied to the second plasma control plate according to an embodiment.

FIG. 4 is a view illustrating a substrate processing apparatus according to another embodiment of the present invention.

BEST MODE

Mode for Invention

Hereinafter, embodiments of the present invention will be described in detail with reference to accompanying drawings. Embodiments of the present invention may be modified in various forms, and the scope of the present invention should not be construed as being limited to the following embodiments. This embodiment is provided to more completely explain the present invention to those of ordinary skill in the art. Accordingly, the shapes of elements in the drawings are exaggerated to emphasize a clearer description.

FIG. 1 is a view illustrating a substrate processing apparatus according to an embodiment of the present invention.

Referring to FIG. 1, a substrate processing apparatus 1 includes a chamber 10, a plasma control plate 20, a susceptor 30, a plasma excitation unit 40, and a plasma control power source 50.

The substrate processing apparatus 1 processes a substrate by using plasma. For example, the substrate processing apparatus 1 may perform an etching process, a deposition process, an ashing process, and the like on a substrate by using excited plasma. In detail, the substrate processing apparatus 1 according to an embodiment of the present invention performs a process on a substrate in units of atomic layer.

The chamber 10 provides a space in which a substrate is placed and a process is performed. The chamber 10 may be made of a conductive material such as aluminum or stainless steel. The chamber 10 may be provided in a grounded state.

The plasma control plate 20 is provided inside the chamber 10. The plasma control plate 20 is provided to have an area corresponding to an area along a cross-section of the inner space of the chamber 10 so that the inner space of the chamber 10 is partitioned in the vertical direction.

The plasma control plate 20 includes a first plasma control plate 21 and a second plasma control plate 22.

The first plasma control plate 21 is located in the upper area of the space inside the chamber 10. Holes are formed in the first plasma control plate 21. For example, holes may be formed in the first plasma control plate 21 in a grid shape. The first plasma control plate 21 may be made of a conductive material.

The second plasma control plate 22 is spaced apart from the first plasma control plate 21 by a set interval, and is positioned below the first plasma control plate 21. Thus, the space inside the chamber 10 is partitioned into an excitation space above the first plasma control plate 21, a control space between the first and second plasma control plates 21 and 22, and a process space below the second plasma control plate 22. Holes are formed in the second plasma control plate 22. As an example, holes may be formed in a grid shape in the second plasma control plate 22. The second plasma control plate 22 may be made of a conductive material.

An opening 101 through which a substrate may be loaded into or unloaded out of the process space is formed at one side of the chamber 10, and the opening 101 may be opened and closed by a gate valve 102.

The susceptor 30 is located inside the chamber 10 to support a substrate to be processed. The susceptor 30 is located in the process space.

An exhaust port 103 may be formed at a lower portion of the chamber 10. The exhaust port 103 may be connected to an exhaust member 104. The exhaust member 104 may provide a suction pressure to cause the exhaust to be made to the inner space of the chamber 10.

An upper gas supply hole 105 is formed in the chamber 10. An upper gas supply hole 105 may be formed in a sidewall of the chamber 10. The upper gas supply hole 105 is formed to be connected to the excitation space. The upper gas supply hole 105 is connected to an upper gas supply source 106. The upper gas supply source 106 supplies gas. For example, the gas supplied from the upper gas supply source 106 may be a compound containing an inert gas such as argon or helium, nitrogen, chlorine, or silicon.

A lower gas supply hole 107 may be formed in the chamber 10. The lower gas supply hole 107 may be formed in a sidewall of the chamber 10. The lower gas supply hole 107 is formed to be connected to the process space. The lower gas supply hole 107 is connected to a lower gas supply source 108. The lower gas source 108 supplies gas. The lower gas source 108 may be provided in the same or different configuration as the upper gas supply source 106. For example, the gas supplied from the lower gas supply source 108 may be provided as a compound containing an inert gas such as argon or helium, nitrogen, chlorine, or silicon.

A cover part 110 is positioned on the upper portion of the chamber 10, so that the inside of the chamber 10 is blocked. The cover part 110 may be provided in a plate shape to form an upper wall of the chamber 10. In addition, the cover part 110 may be provided in the shape of a container that is opened downward to form an upper wall and an upper side wall of the chamber 10.

The cover part 110 allows energy generated from the plasma excitation unit 40 to be transmitted into the inner space of the chamber 10. The cover part 110 may be made of a dielectric material such as quartz. In addition, the cover part 110 may be a conductor having a slit formed therein.

The plasma excitation unit 40 is located above the chamber 10 and provides energy for excitation of the excitation gas supplied to the excitation space into plasma. For example, the plasma excitation unit 40 may be provided as an antenna positioned adjacent to the outer surface of the cover part 110 to provide energy for plasma excitation in an inductively coupled plasma scheme. In this case, the antenna may be provided to be positioned outside the upper wall of the chamber 10, positioned outside the upper sidewall, or positioned outside the upper wall and the upper sidewall.

As another example, the plasma excitation unit 40 may be provided as a microwave application unit connected to the outer surface of the cover part 110, so that the microwave generated from the microwave application unit penetrates the cover part 110 and then is supplied to the excitation space, thereby exciting the excitation gas into plasma.

The plasma control power source 50 controls the force applied to the plasma to control the state of the plasma used for processing the substrate, or the plasma state and the amount of energy. The plasma control power source 50 is connected to the first plasma control plate 21 and the second plasma control plate 22.

FIG. 2 is a diagram illustrating the voltage applied to the first plasma control plate according to an embodiment. FIG. 3 is a diagram illustrating the voltage applied to the second plasma control plate according to an embodiment.

Referring to FIGS. 2 and 3, the plasma control power source 50 applies a voltage having a magnitude less than or equal to the ground state to the first plasma control plate 21, and applies a voltage having a magnitude greater than or equal to the ground state to the second plasma control plate 22.

The plasma control power source 50 may apply a negative voltage in the form of a pulse to the first plasma control plate 21. In addition, the plasma control power source 50 may apply a voltage to the first plasma control plate 21 in such a way that a negative voltage of a predetermined magnitude is maintained for a predetermined time.

The plasma control power source 50 may apply a positive voltage in the form of a pulse to the second plasma control plate 22. In addition, the plasma control power source 50 may continuously apply a positive voltage of a predetermined magnitude to the second plasma control plate 22 for a predetermined time.

A control unit (not shown) controls components of the substrate processing apparatus 1.

Hereinafter, the operation of the substrate processing apparatus 1 will be described. As an example, a process in which an etching process is performed by the substrate processing apparatus 1 will be described.

The control unit causes the process gas to be supplied to the chamber 10. The process gas may be supplied through the lower gas supply hole 107 or the upper gas supply source 106. The process gas reacts with the upper surface of the substrate positioned on the susceptor 30 to form a reaction layer. In this case, the amount of the supplied process gas and the supply time of the process gas are controlled, so that the reaction layer may be formed to have an atomic thickness. For example, the process gas may be chlorine or the like.

The control unit controls the exhaust member 104 to exhaust the process gas from the chamber 10.

Thereafter, the control unit causes the excitation gas to be supplied to the chamber 10, and operates the plasma excitation unit 40 so that the excitation gas supplied to the chamber 10 is excited into a plasma state. Accordingly, positively charged ions and negatively charged electrons are generated in the excitation space. The excitation gas may be supplied through the upper gas supply source 106. In addition, the excitation gas may be supplied through the lower gas supply source 108 to control the state of the process space in which the substrate is located.

The control unit operates the plasma control power source 50 together with or prior to the excitation of the plasma, thereby controlling a state in which the plasma generated in the excitation space is supplied to the process space. In detail, the first plasma control plate 21 has a negative voltage, so that a repulsive force is generated between the electrons and the first plasma control plate 21. Accordingly, only electrons having energy capable of overcoming the repulsive force of the first plasma control plate 21 among electrons in the excitation space pass through the first plasma control plate 21 and are supplied to the control space. In addition, the amount of electrons supplied from the excitation space to the control space may be controlled by setting the voltage applied to the first plasma control plate 21 in a pulse form or by adjusting the magnitude of the negative voltage. In addition, since the second plasma control plate 22 has a positive voltage, a repulsive force is generated between the ions and the second plasma control plate 22, so that the ions in the control space are blocked from moving into the process space. In addition, the electrons supplied into the control space receive a force in the process space direction by the repulsive force between the first plasma control plates 21 and the attractive force between the second plasma control plates 22, so that the electrons are supplied to the process space in the state where energy is adjusted. Accordingly, the electrons react with the reaction layer of the substrate to perform etching at the atomic thickness. When a pulse type voltage is applied to the first and second plasma control plates 21 and 22, the sink of the voltage applied to the first plasma control plate 21, the second plasma control plate 22, or the first and second plasma control plate 21 and 22 may be adjusted. For example, when the first plasma control plate 21 is −V1, the second plasma control plate 21 may control the sink to be 0, or V2, or include a section in which the voltage changes from 0 to V or V2 to 0.

Thereafter, the control unit controls the exhaust member 104 to discharge the etching by-products from the chamber 10.

The above-described process may be performed once, or repeated twice or more, so that the process thickness may be adjusted by a multiple of the atomic thickness.

The substrate processing apparatus 1 according to an embodiment of the present invention performs the process processing by using electrons. In a conventional substrate process using ions, the reaction layer is etched by energy provided by ions (e.g., Ar+ions when argon is used as an excitation gas). In this case, excessive energy is applied to the substrate while the ions react with the substrate due to the mass of the ions, thereby causing damage to the substrate. Such damage causes the processed substrate to have a structure different from that originally intended, and increases the leakage current according to the miniaturization of the line width or increases the contact resistance in the metal deposition or annealing process, thereby reducing device performance. To the contrary, electrons have a very small mass compared to ions. Accordingly, the process of processing a substrate using electrons by a substrate processing apparatus according to an embodiment of the present invention does not cause the above-described problem to the substrate during the processing process. In addition, the amount of electrons and energy of electrons used for processing the substrate are controlled by the plasma control power source 50, so that the process is performed with an atomic thickness while preventing the substrate from being damaged. In addition, since the process is performed by supplying the electrons extracted from the plasma to the substrate after excitation of the plasma in the excitation space, the process may be effectively performed even on a large-area substrate.

In addition, the substrate processing apparatus 1 may perform a deposition process.

The control unit causes the process gas to be supplied to the chamber 10. The process gas may be supplied through the lower gas supply hole 107 or the upper gas supply source 106. The process gas reacts with the upper surface of the substrate positioned on the susceptor 30 to form a reaction layer. For example, the process gas may be oxygen radical, a silicon source, or the like.

The control unit controls the exhaust member 104 to exhaust the process gas from the chamber 10.

Thereafter, the control unit causes the excitation gas to be supplied to the chamber 10, and operates the plasma excitation unit 40 so that the excitation gas supplied to the chamber 10 is excited into a plasma state. Thereafter, the control unit performs a control similar to that described above in the etching process, so that only electrons are selectively supplied to the substrate. Accordingly, the electrons supply energy for the reaction between the reaction layer and the material of the layer located below the reaction layer to react with each other.

Thereafter, the control unit controls the exhaust member 104 to discharge the process by-products from the chamber 10.

The above-described process may be performed once, or repeated twice or more, so that the thickness of the process may be adjusted by a multiple of the atomic thickness. In addition, materials of the sequentially deposited reaction layers may be the same or different from each other. For example, an oxygen layer is first formed on a substrate in atomic units, and a silicon layer is formed on an upper surface thereof in atomic units, so that a silicon oxide layer may be deposited at an atomic thickness.

The process gas and excitation gas in the above-described etching or deposition process are exemplary, and may be changed to those used as the process gas and excitation gas in the conventional etching process and deposition process.

Energy is required for a reaction to occur between the reaction layer and the substrate or between the reaction layers. In the case of a conventional substrate processing apparatus, such energy is supplied through a heater located in the susceptor or ions. Then energy provided by the heater or ions is relatively large and difficult to be controlled in small units, so that the energy is not suitable to be used when deposition is performed with an atomic thickness. To the contrary, the substrate processing apparatus 10 according to an embodiment of the present invention provides such energy through electrons, so that, when deposition is performed with an atomic thickness, a corresponding amount of energy may be effectively supplied.

FIG. 4 is a view illustrating a substrate processing apparatus according to another embodiment of the present invention.

Referring to FIG. 4, a substrate processing apparatus 1a includes a chamber 10a, a plasma control plate 20a, a susceptor 30a, a plasma excitation unit 40a, and a plasma control power source 50a.

The plasma control plate 20a is provided to have an area corresponding to an area along a cross-section of the inner space of the chamber 10a so that the inner space of the chamber 10a is partitioned in the vertical direction. Accordingly, an excitation space is formed above the plasma control plate 20a, and a process space is formed below the plasma control plate 20a. Holes are formed in the plasma control plate 20a. For example, holes may be formed in a grid shape in the plasma control plate 20a.

The plasma control power source 50a controls the force applied to the plasma to control the state of the plasma used for processing the substrate, or the plasma state and the amount of energy. The plasma control power source 50a is connected to the plasma control plate 20a and the susceptor 30a.

The plasma control power source 50a applies a voltage having a magnitude less than or equal to the ground state to the plasma control plate 20a, and applies a voltage having a magnitude greater than or equal to the ground state to the susceptor 30a.

The plasma control power source 50a may apply a negative voltage in the form of a pulse to the plasma control plate 20a. In addition, the plasma control power source 50a may apply a voltage to the plasma control plate 20 in such a way that a negative voltage of a predetermined magnitude is maintained for a predetermined time. Accordingly, when the control unit operates the plasma control power source 50a, the plasma control plate 20a has a negative voltage, so that a repulsive force is generated between the electrons and the plasma control plate 20a. Accordingly, only electrons having energy capable of overcoming the repulsive force caused by the plasma control plate 20a among the electrons in the excitation space pass through the plasma control plate 20a and are supplied to the process space.

In addition, the amount of electrons supplied from the excitation space to the process space may be controlled by setting the voltage applied to the plasma control plate 20a in a pulse form or by adjusting the magnitude of the negative voltage.

The plasma control power source 50 may apply a positive voltage in the form of a pulse to the susceptor 30a. In addition, the plasma control power source 50 may continuously apply a positive voltage of a predetermined magnitude to the susceptor 30a for a predetermined time. Accordingly, when the control unit operates the plasma control power source 50a, the susceptor 30a has a positive voltage, so that a repulsive force is generated between the ions and the susceptor 30a, thereby preventing the ions from moving toward the substrate. In addition, the electrons supplied to the process space receive a force toward the substrate by the repulsive force between the plasma control plates 20a and the attractive force between the susceptors 30a, so that the electrons react with the substrate in a state in which the state of energy is controlled.

Since the configuration of the chamber 10a, the susceptor 30a, the plasma excitation unit 40a, etc. in addition to the plasma control plate 20a and the plasma control power source 50a connected thereto in the substrate processing apparatus 1a according to the present embodiment is the same as or similar to the substrate processing apparatus of FIG. 1, the repeated description thereof will be omitted.

The process of processing a substrate by the substrate processing apparatus 1a according to the present embodiment is similar to that of the substrate processing apparatus 1 of FIG. 1, and thus a repeated description will be omitted.

The above detailed description is illustrative of the present invention. In addition, the above description shows and describes preferred embodiments of the present invention, and the present invention may be used in various other combinations, modifications, and environments. That is, changes or modifications are possible within the scope of the concept of the invention disclosed herein, the scope equivalent to the written disclosure, and/or within the scope of skill or knowledge in the art. The written embodiments describe the best state for implementing the technical idea of the present invention, and various changes required in the specific application field and use of the present invention are possible. Therefore, the detailed description of the present invention is not intended to limit the present invention to the disclosed embodiments. In addition, the appended claims should be construed as including other embodiments.

The invention claimed is:

1. A substrate processing apparatus comprising:
   a chamber;
   a plasma excitation unit located on an upper part of the chamber;
   a susceptor located inside the chamber to support a substrate;
   a first plasma control plate located above the susceptor and forming an excitation space between the upper part of the chamber and thereof;
   a second plasma control plate located below the first plasma control plate and forming a control space between the first plasma control plate and thereof;
   a plasma control power supply applying voltage to the first plasma control plate and the second plasma control plate;
   an upper gas supply source supplying an excitation gas to the excitation space;
   a lower gas supply source supplying a process gas to a process space between the second plasma control plate and the susceptor; and
   a control unit configured to:
      control the lower gas supply source so that the process gas is supplied to the process space to form a reaction layer on the substrate,
      control the upper gas supply source so that the excitation gas is supplied to the excitation space, and
      control the plasma control power so that a negative voltage is applied to the first plasma control plate and a positive voltage is applied to the second plasma control plate to etch the reaction layer.

2. The substrate processing apparatus of claim 1, wherein each of the negative voltage and the positive voltage are a pulsed D.C. voltage.

3. The substrate processing apparatus of claim 1, wherein the control unit controls a first plasma control power source and a second plasma control power source so that when the negative voltage is applied to the first plasma control plate, the voltage applied to the second plasma control plate changes from 0 V to the positive voltage and from the positive voltage to 0 V.

4. The substrate processing apparatus of claim 1, wherein the process gas includes an inert gas, nitrogen, chlorine, and silicon.

5. The substrate processing apparatus of claim 1, wherein the reaction layer comprises:
   an oxygen layer formed on the substrate in atomic units; and
   a silicon layer formed on an upper surface of the oxygen layer in atomic units.

* * * * *